(12) United States Patent
Fukano et al.

(10) Patent No.: US 10,193,525 B2
(45) Date of Patent: Jan. 29, 2019

(54) ACOUSTIC WAVE DEVICE AND METHOD FOR MANUFACTURING SAME

(71) Applicant: KYOCERA Corporation, Kyoto (JP)

(72) Inventors: Toru Fukano, Kyoto (JP); Junya Nishii, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 902 days.

(21) Appl. No.: 14/627,676

(22) Filed: Feb. 20, 2015

(65) Prior Publication Data

US 2015/0162893 A1 Jun. 11, 2015

Related U.S. Application Data

(60) Division of application No. 14/321,232, filed on Jul. 1, 2014, now Pat. No. 8,975,803, which is a division
(Continued)

(30) Foreign Application Priority Data

Nov. 28, 2008 (JP) .................................. 2008-304900

(51) Int. Cl.
*H03H 9/17* (2006.01)
*H03H 3/08* (2006.01)
(Continued)

(52) U.S. Cl.
CPC ........... *H03H 9/171* (2013.01); *H01L 41/047* (2013.01); *H01L 41/0533* (2013.01); *H03H 3/08* (2013.01);
(Continued)

(58) Field of Classification Search
CPC .... H03H 9/171; H01L 41/047; H01L 41/0533
(Continued)

(56) References Cited

U.S. PATENT DOCUMENTS 7,239,068 B2* 7/2007 Miyaji ..................... H03H 3/08
310/340
7,304,417 B2* 12/2007 Masuko ................... H03H 9/08
310/344
(Continued)

FOREIGN PATENT DOCUMENTS

JP 2003051677 A 2/2003
JP 2005-252335 A 9/2005
(Continued)

OTHER PUBLICATIONS

Office Action dated May 18, 2016, issued in counterpart Chinese application No. 201410301667.5.
(Continued)

*Primary Examiner* — Thomas Dougherty
*Assistant Examiner* — Karen B Addison
(74) *Attorney, Agent, or Firm* — Procopio Cory Hargreaves and Savitch LLP (57) ABSTRACT

An SAW device (1) has a piezoelectric substrate (3) propagating acoustic waves, and a comb-shaped electrode (6) arranged on a first surface (3a) of the piezoelectric substrate (3). The SAW device (1) has a columnar terminal (15) located on the first surface (3a) and electrically connected to the comb-shaped electrode (6), and a cover member (9) covering the a side surface of the terminal (15). The terminal (15) comprises, in a first region in the height direction of height thereof, a larger diameter on the side of the first surface (3a) compared with the diameter on the side opposite to the first surface (3a).

30 Claims, 8 Drawing Sheets

Related U.S. Application Data of application No. 13/131,854, filed on May 27, 2011, now Pat. No. 8,810,111, which is a continuation-in-part of application No. PCT/JP2009/069802, filed on Nov. 24, 2009.

(51) Int. Cl.

| | | |
|---|---|---|
| *H03H 9/25* | (2006.01) | |
| *H03H 9/02* | (2006.01) | |
| *H03H 9/05* | (2006.01) | |
| *H03H 9/10* | (2006.01) | |
| *H01L 41/047* | (2006.01) | |
| *H01L 41/053* | (2006.01) | |

(52) U.S. Cl.
CPC ........ *H03H 9/02897* (2013.01); *H03H 9/059* (2013.01); *H03H 9/1071* (2013.01); *H03H 9/172* (2013.01); *H03H 9/25* (2013.01); *Y10T 29/49005* (2015.01)

(58) Field of Classification Search
USPC ... 310/313 R, 348, 344, 365, 366, 367, 369, 310/311, 349, 313 B, 313 C
See application file for complete search history.

(56) References Cited

U.S. PATENT DOCUMENTS

| | | | |
|---|---|---|---|
| 7,629,729 B2 * | 12/2009 | Inoue | ............... H03H 3/08 |
| | | | 310/313 R |
| 7,854,050 B2 | 12/2010 | Aikawa et al. | |
| 8,154,170 B2 | 4/2012 | Kimura et al. | |
| 8,436,514 B2 | 5/2013 | Fukano et al. | |
| 8,810,111 B2 | 8/2014 | Fukano et al. | |
| 2009/0096551 A1 | 4/2009 | Yamagata | |
| 2010/0225202 A1 | 9/2010 | Fukano et al. | |

FOREIGN PATENT DOCUMENTS

| | | |
|---|---|---|
| JP | 2006108993 A | 4/2006 |
| JP | 2007208665 A | 8/2007 |
| JP | 2008005241 A | 1/2008 |
| JP | 2008124785 A | 5/2008 |
| JP | 2008153957 A | 7/2008 |
| JP | 2008235432 A | 10/2008 |
| JP | 2010056671 A | 3/2010 |
| WO | 2007114390 A1 | 10/2007 |

OTHER PUBLICATIONS

Office Action dated May 17, 2013 issued in counterpart Chinese application No. 200980147737.3.

\* cited by examiner

ACOUSTIC WAVE DEVICE AND METHOD FOR MANUFACTURING SAME

CROSS REFERENCE TO RELATED APPLICATIONS

This application is a divisional of U.S. application Ser. No. 13/321,232 filed Jul. 1, 2014, which is a divisional of U.S. application Ser. No. 13/131,854 filed May 27, 2011, which is a 371 of International App. No. PCT/JP2009/069802 filed Nov. 11, 2009, which claims benefit of Japanese App. No. 2008-304900 filed Nov. 28, 2008. Each of these applications is incorporated herein by reference in its entirety.

TECHNICAL FIELD

The present invention relates to acoustic wave devices such as a surface acoustic wave (SAW) device, a film bulk acoustic resonator (FBAR), or the like and a method for manufacturing the same.

BACKGROUND ART

An acoustic wave device of a so-called "wafer level package" for the purpose of reduction of size etc. is known. In this acoustic wave device, an excitation electrode arranged on the surface of the element substrate is sealed by a resin while being accommodated in a vibration space. In other words, the excitation electrode is covered by a cover member. Further, a columnar terminal connected to the excitation electrode is vertically provided on the surface of the element substrate. The columnar terminal is exposed at its front end side portion (portion on the side opposite to the surface of the element substrate) from the cover member. Further, the acoustic wave device is mounted on a circuit board by soldering of the exposed portion of the columnar terminal to the circuit board and so on. Patent Literature 1 discloses an elastic wave device in which a columnar terminal is formed in a taper (inverse taper) where the diameter of the front end side portion becomes larger than that of the root side portion (portion of the element substrate on the side by the surface).

An acoustic wave device is sometimes subjected to a force in a direction making it move from the circuit board due to gravity, impact upon dropping, and so on. At this time, since the terminal of the acoustic wave device is fixed at its front end side portion to the circuit board, force ends up being applied in a direction pulling it out from the cover member.

Accordingly, preferably an acoustic wave device able to restrain the terminal from being pulled out from the cover member and a method for manufacturing the same are provided.

Patent Literature 1: Japanese Patent Publication (A) No. 2007-208665

SUMMARY OF INVENTION

An acoustic wave device according to an embodiment of the present invention has a substrate configured to propagate acoustic waves; a terminal with a pillar-shape located on a surface of the substrate and comprising a first region in a direction of height thereof with a cross-sectional area of surface side larger than a cross-sectional area of the side opposite to that surface; an excitation electrode located on the surface of the substrate and electrically connected to the terminal; and a cover member covering a side surface of the first region of the terminal.

A method for manufacturing an acoustic wave device according to an embodiment of the present invention has a step of arranging an excitation electrode on a surface of a substrate which propagates acoustic waves; a step of forming a terminal with a pillar-shape which is electrically connected to the excitation electrode and which is located on the surface and which comprises a first region in a height direction thereof with a cross-sectional area of the surface side larger than a cross-sectional area of the side opposite to that surface; and a step of forming a cover member which forms a hollow vibration space above the excitation electrode and covers the side surface of the terminal.

Effects of Invention

According to the above acoustic wave device, the terminal of the acoustic wave device can be restrained from being pulled out of the cover member.

BRIEF DESCRIPTION OF DRAWINGS

FIGS. 1 A and B are a schematic plan view and cross-sectional view showing a SAW device according to an embodiment of the present invention.

FIGS. 2 A to D are schematic cross-sectional views for explaining a method for manufacturing the SAW device of FIG. 1A and FIG. 1B.

FIGS. 3 A to D are schematic cross-sectional views continuing from FIG. 2D.

FIGS. 4 A and B are schematic cross-sectional views continuing from FIG. 3D.

FIGS. 5 A to C are schematic cross-sectional views showing SAW devices according to first to third modifications of the present invention.

FIGS. 6 A to D are schematic cross-sectional views for explaining a method for manufacturing a SAW device according to a fourth modification of the present invention.

DESCRIPTION OF EMBODIMENTS

<Structure of SAW Device>

Figure 1A:
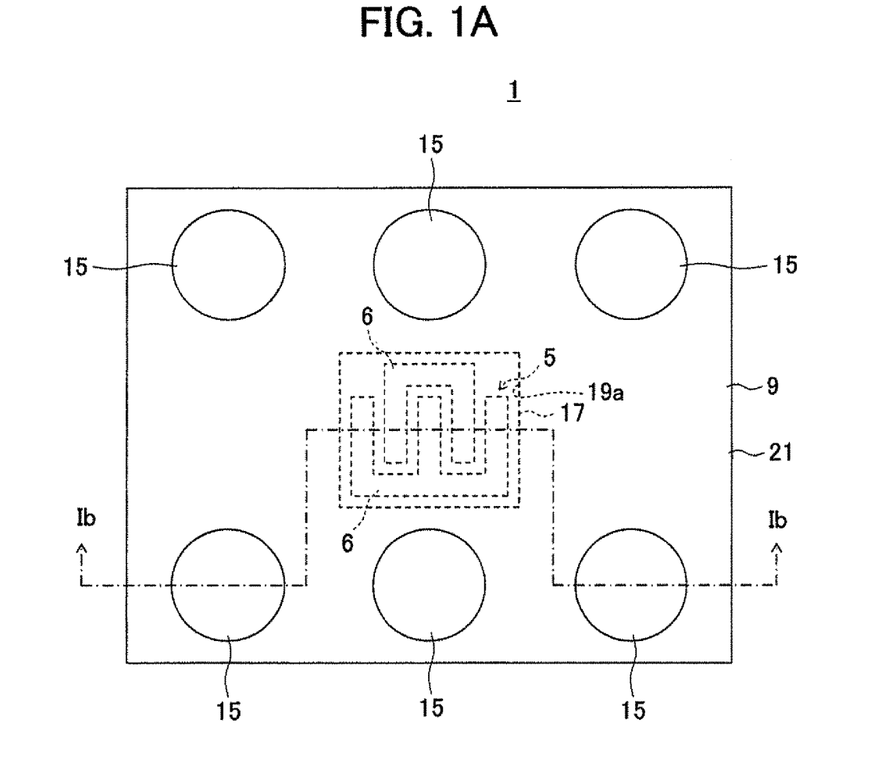
Figure 1B:
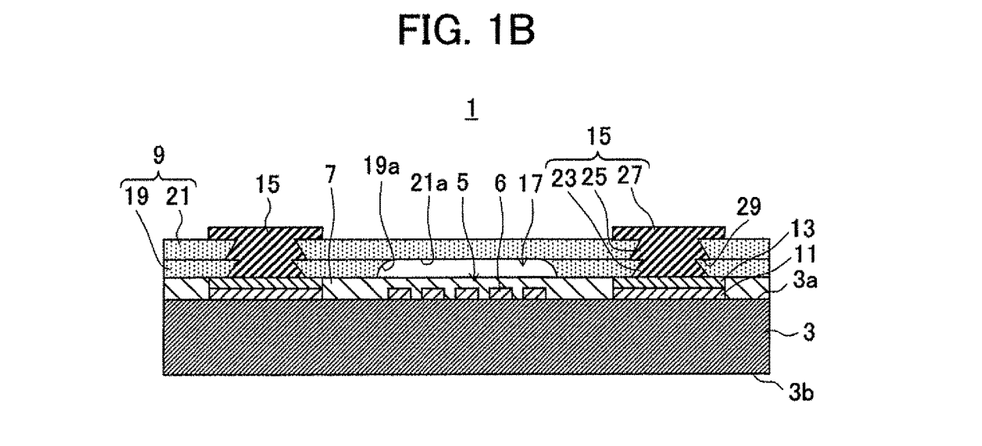

FIG. 1A is a schematic plan view showing a SAW device 1 according to an embodiment of the present invention. FIG. 1B is a schematic cross-sectional view taken along the Ib-Ib line in FIG. 1A. Note that, FIGS. 1A and 1B schematically show the SAW device 1 for facilitating understanding of the SAW device 1. In execution, the sizes, numbers, shapes etc. of parts of the SAW device 1 may be suitably set as well.

The SAW device 1 has a piezoelectric substrate 3, a SAW element 5 arranged on the piezoelectric substrate 3, a protective layer 7 and cover member 9 for protecting the SAW element 5, and a connection-use conductor 11, a connection strengthening layer 13 and a terminal 15 for electrically connecting the SAW element 5 with a not shown electronic circuit.

The piezoelectric substrate 3 is a block-shaped single crystal substrate having a piezoelectric property such as a lithium tantalite single crystal, a lithium niobate single crystal or the like. The piezoelectric substrate 3 has a first surface 3a and a second surface 3b on the back surface side of that. Note that, in FIG. 1A and FIG. 1B, a case where an electrode etc. are arranged on only the first surface 3a is exemplified. However, an electrode etc. may be arranged on the second surface 3b as well.

The SAW element 5 has a plurality of pairs of comb-shaped electrodes (IDT electrodes) 6 formed on the first surface 3a of the piezoelectric substrate 3. Each comb-shaped electrode 6 has a plurality of electrode fingers extending in a direction perpendicular to a direction of propagation of the SAW on the piezoelectric substrate 3 (left-right direction on the sheet surface of FIG. 1A and FIG. 1B). Each pair of comb-shaped electrodes 6 are formed so that their electrode fingers mesh with each other.

Note that, FIG. 1A and FIG. 1B are schematic views, therefore show only a pair of comb-shaped electrodes 6 comprised of a comb-shaped electrode 6 having two electrode fingers and a comb-shaped electrode 6 having three electrode fingers. In actuality, several pairs of comb-shaped electrodes having numbers of electrode fingers larger than those may be provided as well. Further, a ladder type SAW filter or double mode SAW resonator filter etc. may be configured by connection of a plurality of SAW elements 5 by serial connection, parallel connection, or another method. At both ends of the SAW element 5, reflectors (may be grasped as portions of the SAW element 5 as well) having comb-shaped electrodes may be provided as well. The SAW element 5 is formed by, for example, an Al alloy such as an Al—Cu alloy or the like.

The protective layer 7 covers the SAW element 5 and contributes to prevention of oxidation etc. of the SAW element 5. The protective layer 7 is formed by a material which has an insulating property and is light enough in weight to an extent that it does not exert an influence upon the propagation of a SAW. For example, the protective layer 7 is made of silicon oxide, silicon nitride, silicone, or the like.

The cover member 9 covers the SAW element 5 from the top of the protective layer 7. Note, the cover member 9 forms a vibration space 17 above the SAW element 5 for making propagation of SAW easy. In other words, the cover member 9 has a wall section 19 forming an inner wall 19a of the vibration space 17 and has a lid 21 forming a ceiling 21a of the vibration space 17.

The thickness of the layer forming the wall section 19 (height of the wall section 19 from the first surface 3a) and the thickness of the lid 21 may be suitably set. For example, these thicknesses are several micrometers to 30 µm. The wall section 19 and lid 21 are formed to for example substantially equal thicknesses.

The wall section 19 and the lid 21 may be formed by separate materials or formed by different materials. The wall section 19 and lid 21 are formed by, for example, a photo-curable material which is cured by irradiating UV-rays, visible rays, or other light. In other words, the wall section 19 and lid 21 are formed by negative type photoresists. The photocurable material is for example a resin which is cured by radical polymerization of acrylic groups, methacrylic groups, or the like. More specifically, this is a urethane acrylate-based, polyester acrylate-based, or epoxy acrylate-based resin.

In the vibration space 17, as shown in FIG. 1B, the cross-section is formed to a substantially rectangular state. The corners at the lid 21 side are formed by curved surfaces. In other words, the inner wall 19a configuring the vibration space 17 is inclined inwardly the further from the first surface 3a of the substrate 3. The planar shape of the vibration space 17 (shape in the plan view of the first surface 3a) may be suitably set. For example, the planar shape of the vibration space 17 is formed to a rectangular shape. The size of the vibration space 17 may be suitably set.

The connection-use conductor 11 is for connecting the SAW element 5 and the terminal 15. The connection-use conductor 11 is for example formed on the first surface 3a of the piezoelectric substrate 3 in the same way as the SAW element 5. The connection-use conductor 11 is formed on the first surface 3a in a suitable pattern for connection to the SAW element 5 although this is not particularly shown. Further, the connection-use conductor 11 is formed so that it has a broadness at least equivalent to the end face of the terminal 15 on the first surface 3a side at the position where the terminal 15 is arranged. The connection-use conductor 11 is formed by for example the same material as that for the SAW element 5 and is formed to the same thickness as that of the SAW element 5.

The connection strengthening layer 13 is for reinforcing the relatively thinly formed connection-use conductor 11 and strengthening the connection of the connection-use conductor 11 with the terminal 15. The connection strengthening layer 13 is stacked on the connection-use conductor 11 at the position of arrangement of the terminal 15. Further, the connection strengthening layer 13 is formed to have a broadness equal to that of the end face of the terminal 15 on the first surface 3a side or more. The connection strengthening layer 13 is for example formed so that a thickness of the connection-use conductor 11 and the connection strengthening layer 13 is substantially equal to a thickness of the protective layer 7, and the connection strengthening layer 13 is exposed from the protective layer 7. The connection strengthening layer 13 is formed by for example chromium or nickel.

Figure 8:
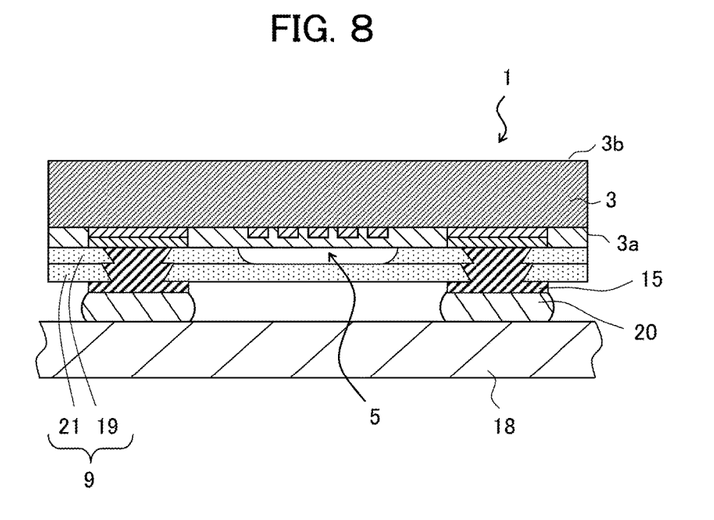
FIG. 8 A schematic cross-sectional view showing a SAW device and a circuit board.

The terminal 15 is provided on the connection strengthening layer 13. Accordingly, the terminal 15 is electrically connected through the connection strengthening layer 13 and connection-use conductor 11 to the SAW element 5. Further, the terminal 15 is formed in a columnar shape and is vertically provided from the first surface 3a. Further, as shown in FIG. 8, the front end side portion of the terminal 15 is exposed from the cover member 9 so that it can be connected to a circuit board 18 etc. with solder 20. The terminal 15 is formed by for example solder, Cu, Au, or Ni.

The terminal 15 has a first columnar section 23 which forms the root side portion of the columnar portion and has a side surface which is covered by the wall section 19, a second columnar section 25 which forms the front end side portion of the columnar portion and has a side surface which is covered by the lid 21, and a land 27 which is exposed from the lid 21.

Each of the first columnar section 23 and the second columnar section 25 is formed in a taper where its first surface 3a side has a diameter larger than the side opposite to the first surface 3a. In other words, in the terminal 15, in at least a portion (first region) thereof, the cross-sectional area of the first surface 3a side is made larger than the cross-sectional area of the side opposite to the first surface 3a. Note that, the first columnar section 23 may be grasped as the first region or the second columnar section 25 may be grasped as the first region. The end face of the first columnar section 23 on the second columnar section 25 side has a diameter smaller than that of the end face of the second columnar section 25 on the first columnar section 23 side. A step 29 where the diameter of the side opposite to the first surface 3a is larger than that of the first surface 3a side is formed at the boundary between the first columnar section 23 and the second columnar section 25.

The first columnar section 23 and the second columnar section 25 are for example formed to substantially the same sizes and shapes. More specifically, in the first columnar section 23 and second columnar section 25, the sizes and diameters of the end faces on the sides opposite to the first surface 3a are substantially the same as each other. Further, inclinations of the tapered surfaces are substantially the same as each other.

The land 27 is for example formed so that its area is broader than that of the end face of the second columnar section 25 on the side opposite to the first surface 3a. The outer peripheral part is stacked on the cover member 9.

Note that the shapes of the first columnar section 23, second columnar section 25, and land 27 in the plane view of the first surface 3a may be suitably set. For example, these shapes are circular. Further, the sizes of the first columnar section 23, second columnar section 25, and land 27 in the plane view of the first surface 3a are smaller in comparison with the size of the vibration space 17 in the plane view of the first surface 3a. As an example, in the plane view of the first surface 3a, the diameter of the terminal 15 is 100 µm in contrast to the size 500 µm×500 µm of the vibration space 17.

<Method for Manufacturing SAW Device>

FIG. 2A to FIG. 4B are schematic cross-sectional views for explaining the method for manufacturing the SAW device 1.

Figure 3D:
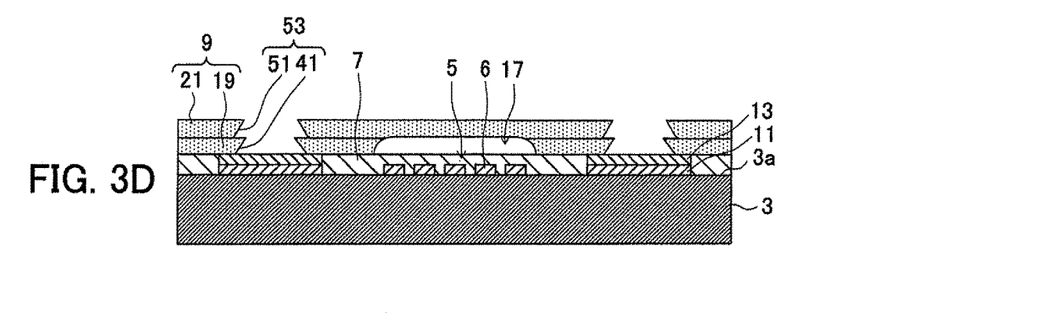
Figure 4A:
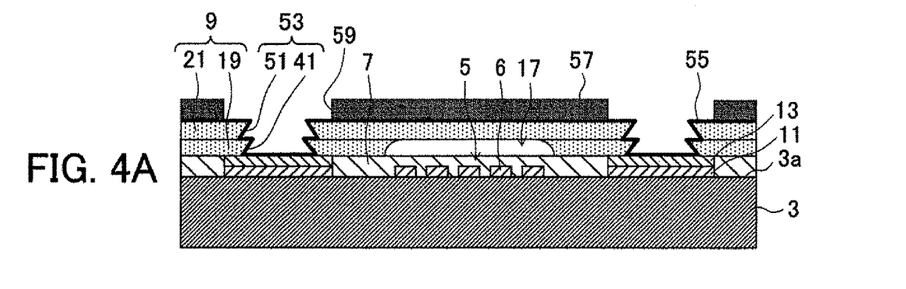
Figure 4B:
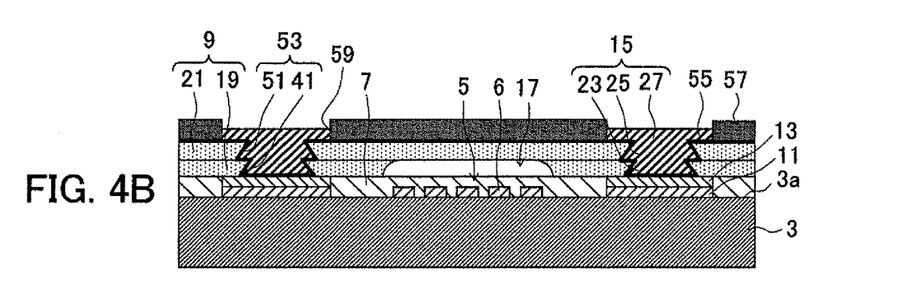

The method for manufacturing the SAW device 1 substantially includes a step of forming the SAW element 5 (FIG. 2A), a step of forming the cover member 9 (FIG. 2C to FIG. 3D), and a step of forming the terminal 15 (FIG. 4A and FIG. 4B). Specifically, these are as follows.

Figure 2A:
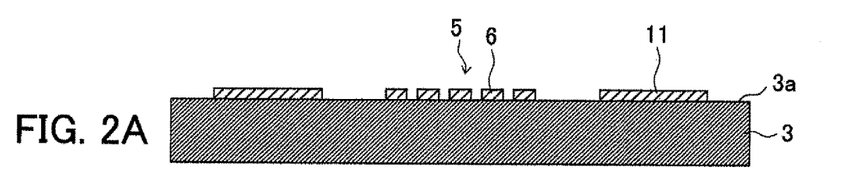

As shown in FIG. 2A, first, on the first surface 3a of the piezoelectric substrate 3, the SAW element 5 and connection-use conductor 11 are formed. Specifically, first, a metal layer is formed on the first surface 3a of the piezoelectric substrate 3a by thin film forming method such as sputtering method, vapor deposition method, CVD (chemical vapor deposition) or the like. Next, the metal layer is patterned by photolithography using a reduced projection exposure apparatus (stepper) and RIE (reactive ion etching) apparatus or the other method. Accordingly, the SAW element 5 and connection-use conductor 11 are formed.

Figure 2B:
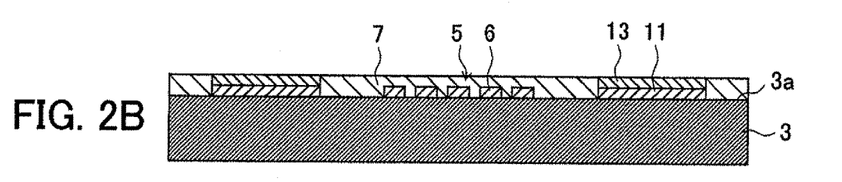

After the SAW element 5 and connection-use conductor 11 are formed, as shown in FIG. 2B, the protective layer 7 and connection strengthening layer 13 are formed. Either of the protective layer 7 or connection strengthening layer 13 may be formed first. For example, first, a thin film which becomes the protective layer 7 is formed to cover the top of the SAW element 5 and connection-use conductor 11 by thin film forming method such as CVD method, vapor deposition method or the like. Next, a portion of the thin film is removed by photolithography so that a portion in the connection-use conductor 11 at the position where the terminal 15 is arranged is exposed. Accordingly, the protective layer 7 is formed. Next, a metal layer is formed on the exposed portion of the connection-use conductor 11 and the protective layer 7 by the vapor deposition method or the like, and the metal layer on the protective layer 7 is removed by photolithography or the like. Accordingly, the connection strengthening layer 13 is formed.

When the protective layer 7 and connection strengthening layer 13 are formed, as shown in FIG. 2C to FIG. 3A, the wall section 19 is formed.

Figure 2C:
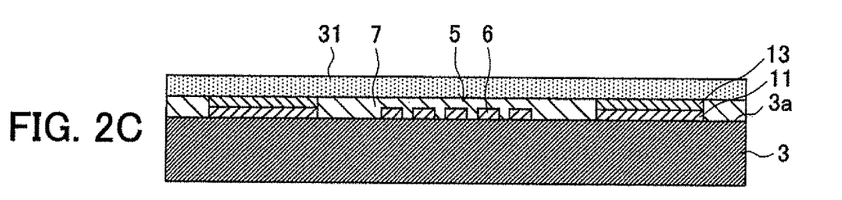
Figure 2D:
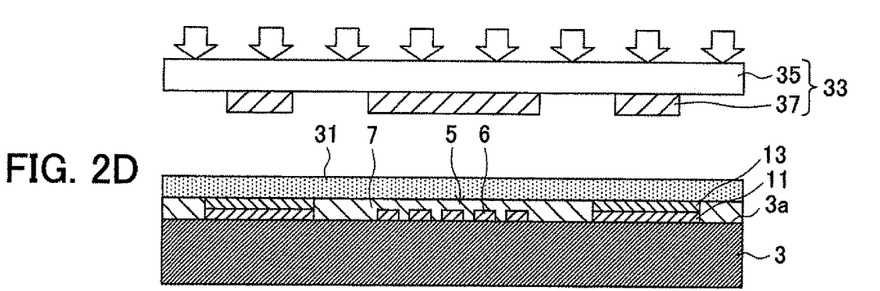

Specifically, first, as shown in FIG. 2C, a wall section-forming layer 31 configuring the wall section 19 is formed on the protective layer 7 and connection strengthening layer 13. The wall section-forming layer 31 is for example formed by adhesion of a film formed by a negative photoresist.

Next, as shown in FIG. 2B, light such as UV-rays or the like is irradiated to the wall section-forming layer 31 through a photomask 33. Namely, exposure process is executed. The photomask 33 is for example configured by the formation of a blocking layer 37 on a transparent substrate 35. The blocking layer 37 is arranged at the position corresponding to the position where the wall section-forming layer 31 must be removed. Namely, it is arranged at the position corresponding to the arrangement position of the vibration space 17 and the arrangement position of the terminal 15. Note that, the exposure may be projection exposure, proximity exposure, or contact exposure.

Figure 3A:
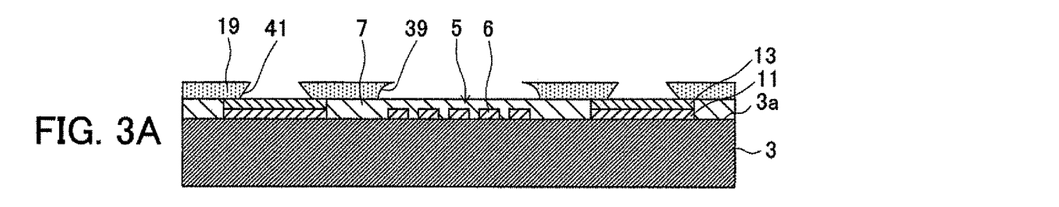

After that, as shown in FIG. 3A, development process is executed. In the wall section-forming layer 31, portions which were irradiated by light are left while portions which were not irradiated by light are removed. Accordingly, in the wall section-forming layer 31, an opening 39 which becomes the vibration space 17 and a first hole portion 41 in which the first columnar section 23 arranged are formed. Namely, the wall section 19 is formed.

Here, at the edge portion of the region irradiated by light in the wall section-forming layer 31, the irradiated light is diffused to the region which is not irradiated by the light in the wall section-forming layer 31, therefore sufficient light does not reach the first surface 3a side. Accordingly, the first surface 3a side of the edge portion of the region which is irradiated by light in the wall section-forming layer 31 is not fully cured and removed. As a result, the first hole portion 41 is formed in a taper (forward taper) having a diameter becoming larger toward the first surface 3a side.

In the same way, the opening 39 is formed in a taper (forward taper) having a diameter becoming larger toward the first surface 3a side. Note that, light diffuses easier in the region in which the opening 39 is formed in comparison with the region in which the first hole portion 41 is formed because the opening 39 is larger than the first hole portion 41 and its edge portion is straight in a plane view etc. Accordingly, in the cross-sectional view, the first hole portion 41 is tapered as a whole. In contrast, in the opening 39, only the portion on the side opposite to the first surface 3a side becomes tapered. Further, in the cross-sectional view, the tapered surface of the opening 39 is shaped so that the tapered surface of the first hole portion 41 is vertically compressed, therefore the curvature becomes larger in comparison with the tapered surface of the first hole portion 41, so it becomes easier to be recognized as a curved surface.

Figure 3B:
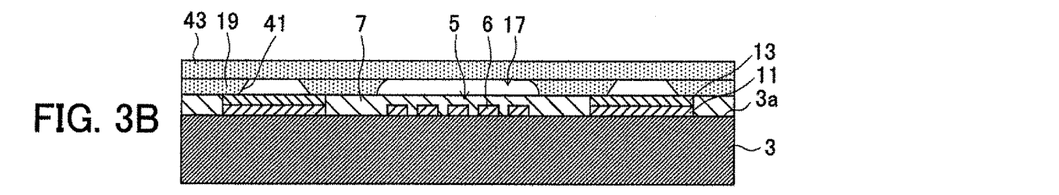
Figure 3C:
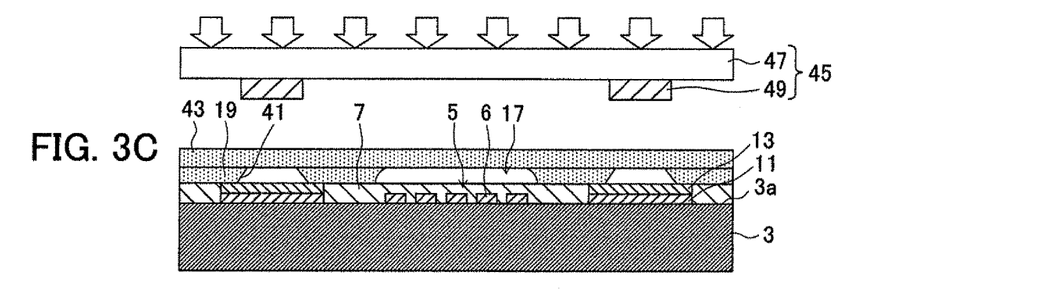

After the first hole portion 41 and opening 39 are formed, as shown in FIG. 3B to FIG. 3D, the lid 21 is formed.

Specifically, first, as shown in FIG. 3B, on the wall section 19, a lid-forming layer 43 for forming the lid 21 is formed. The lid-forming layer 43 is for example formed by adhesion of a film formed by a negative photoresist. Due to the formation of the lid-forming layer 43, the opening 39 of the wall section 19 (FIG. 3A) is closed, and the vibration space 17 is formed. Note that, preferably the wall section-forming layer 31 and the lid-forming layer 43 are joined by heating.

Next, as shown in FIG. 3C, light such as UV-rays or the like is irradiated through a photomask 45 to the lid-forming layer 43. Namely, exposure process is executed. The photomask 45 is configured by the formation of a blocking layer 49 on a transparent substrate 47 in the same way as the photomask 33. The blocking layer 49 is arranged at a position corresponding to the position where the lid-forming layer 43 is to be removed. Namely, it is arranged at a position corresponding to the arrangement position of the terminal 15. The photomask 45 for example is configured by removing, in the photomask 33, a portion corresponding to the vibration space 17 in the blocking layer 37. Note that, the exposure may be projection exposure, proximity exposure, or contact exposure.

After that, as shown in FIG. 3D, development process is executed. In the lid-forming layer 43, portions which were irradiated by light are left while portions which were not irradiated by light are removed. Accordingly, in the lid-forming layer 43, a second hole portion 51 in which the second columnar section 25 is arranged is formed. Namely, the lid 21 is formed. Due to the formation of the lid 21, the cover member 9 is completed by the wall section 19 and lid 21. Note that, the first hole portion 41 and the second hole portion 51 are connected to form a combined hole 53.

After the cover member 9 is formed, as shown in FIG. 4A and FIG. 4B, the terminal 15 is formed. Specifically, first, as shown in FIG. 4A, a plating-use underlayer 55 and a plating-use resist layer 57 are formed.

The plating-use underlayer 55 is formed to cover the cover member 9. Further, the plating-use underlayer 55 is formed on the bottom surface of the combined hole 53 formed by the connection strengthening layer 13 and on the inner circumferential surface of the combined hole 53 formed by the cover member 9. The plating-use underlayer 55 is formed by a Ti—Cu alloy or the like by for example flash plating as a preferred example. When the plating-use underlayer 55 is formed by flash plating, it is not necessary to form an line pattern for making current flow in the plating forming part. Accordingly, reduction of size of the SAW device 1 becomes possible.

The plating-use resist layer 57 is formed on the plating-use underlayer 55. The plating-use resist layer 57 is formed on the substrate by for example spin coating or another technique. In the plating-use resist layer 57, a land-use hole 59 is formed above the combined hole 53. The land-use hole 59 has a diameter larger than the diameter of the combined hole 53 and has a depth (thickness of the plating-use resist layer 57) not less than the thickness of the land 27. The land-use hole 59 is formed by for example photolithography.

Next, as shown in FIG. 4B, the plating-use underlayer 55 exposed through the land-use hole 59 is plated. Accordingly, metal is filled in the combined hole 53 and land-use hole 59. Then, the first columnar section 23 is formed by the metal filled in the first hole portion 41, the second columnar section 25 is formed by the metal filled in the second hole portion 51, and the land 27 is formed by the metal filled in the land-use hole 59. Note that, in the land-use hole 59, the metal does not have to be filled up to the surface of the plating-use resist layer 57. The metal may be filled up to a suitable depth of the land-use hole 59. The plating method may be suitably selected, but electroplating is preferred. This is because electroplating gives a high degree of freedom of the height of the columnar terminal 15, and results in a good adhesion with the plating-use underlayer 55.

After that, the plating-use resist layer 57 is removed, and the portion in the plating-use underlayer 55 which has not been exposed from the land-use hole 59 is removed. Accordingly, as shown in FIG. 1B, the SAW device 1 is formed. Note that, in FIG. 1B, illustration of the remaining portion of the plating-use underlayer 55 is omitted. The plating-use resist layer 57 can be removed by for example organic solvent such as acetone, IPA, or the like or alkali organic solvent such as dimethyl sulfoxide or the like. The Cu of the plating-use underlayer 55 can be removed by for example a mixture of iron (II) chloride or phosphoric acid with a hydrogen peroxide solution. Further, the Ti of the plating-use underlayer 55 can be removed by for example a mixture of dilute fluoric acid or ammonia with a hydrogen peroxide solution.

Note that, the above steps are realized by a so-called wafer process. Namely, the steps explained above are carried out on a wafer which is later divided into piezoelectric substrates 3. A large number's worth of the SAW devices are formed in parallel.

According to the above embodiment, the SAW device 1 has the piezoelectric substrate 3 for propagating acoustic waves and the comb-shaped electrodes 6 arranged on the first surface 3a of the piezoelectric substrate 3. Further, the SAW device 1 has the columnar terminal 15 which is provided vertically from the first surface 3a and is electrically connected to the comb-shaped electrodes 6 and has the cover member 9 which forms the hollow vibration space 17 above the comb-shaped electrode 6 and covers the side surface of the terminal 15. Further, in the terminal 15, in at least a portion in the vertical direction, the first surface 3a side has a diameter larger than that of the side opposite to the first surface 3a. Accordingly, when force is applied to the terminal 15 in a direction pulling the terminal 15 out of the cover member 9, the terminal 15 engages with the cover member 9, and pulling the terminal 15 out is restrained. Namely, the durability of the SAW device 1 is improved.

The terminal 15 has a tapered portion (first columnar section 23 and second columnar section 25) in which the first surface 3a side has a diameter larger than that of the side opposite to the first surface 3a. Accordingly, when force is applied to the terminal 15 in a direction pulling the terminal 15 out of the cover member 9, the terminal 15 engages with the cover member 9 over a relatively wide area. As a result, local application of load to the cover member 9 is suppressed. Then, breakage of the cover member 9 and pullout of the terminal 15 due to the breakage are suppressed.

The terminal 15 has, as the tapered portion, the first columnar section 23 and the second columnar section 25 continuing from the side opposite to the first surface 3a in the first columnar section 23. The diameter of the first columnar section 23 at the second columnar section 25 side is smaller than the diameter of the second columnar section 25 at the first columnar section 23 side. Accordingly, while obtaining the same engagement strength against pullout as that in the later explained second modification (see FIG. 5B), the change of the cross-sectional area in the vertical direction at the section parallel to the first surface 3a can be made smaller than that of the second modification. As a result, the ratio of the maximum cross-sectional area with respect to the minimum cross-sectional area of the terminal 15 (exerting an influence upon the electrical resistance of the terminal 15) can be made smaller, and the terminal 15 can be reduced in size. Further, when force is applied to the terminal 15 in a direction pushing against the terminal 15, a portion of that force will be transmitted to the cover member 9, therefore the load of the connection strengthening layer 13 can be lightened. As a result, improvement of the durability and reduction of the thickness or elimination of the connection strengthening layer 13 are facilitated.

The position of the boundary (step 29) between the first columnar section 23 and the second columnar section 25 from the first surface 3a coincides with the position of the ceiling 21a of the vibration space 17 from the first surface 3a. Accordingly, when force is applied in a direction pushing against the terminal 15, the transmission of that force from the step 29 to the lid 21 is suppressed. Consequently, bending of the lid 21 and contact of the ceiling 21a with the bottom surface (protective layer 7) of the vibration space 17 are suppressed. On the other hand, the force in the direction of pushing which is transmitted from the step 29 to the wall section 19 is applied to the entire wall section 19 in the height direction from the first surface 3a, so the force which is transmitted to the wall section 19 can be dispersed over a wide range. Further, in the case where the wall section 19 and the lid 21 are formed by separate steps (separate layers), in each layer, a hole (first hole portion 41 or second hole portion 51) may be formed into simple shape. In other words, it is not necessary to form a hole having a diameter reduced in the middle in the opening direction, so the formation of the combined hole 53 is easy.

An inner wall 19a and a ceiling 21a of the vibration space 17 are formed in an arch shape. Accordingly, bending of the lid 21 is suppressed. As a result, for example, the SAW device 1 can be reduced in size by reducing the height of the vibration space 17.

The method for manufacturing the SAW device 1 has a step (FIG. 2A) of arranging the comb-shaped electrodes 6 on the first surface 3a of the piezoelectric substrate 3 for propagating acoustic waves. Further, the manufacturing method has a step (FIG. 4A and FIG. 4B) of forming a columnar terminal 15 which is electrically connected to the comb-shaped electrodes 6, is vertically provided from the first surface 3a, and has, in at least a portion in the vertical direction, a larger diameter on the first surface 3a side than that of the side opposite to the first surface 3a. Further, the manufacturing method has a step (FIG. 2C to FIG. 3D) of forming the hollow vibration space 17 above the comb-shaped electrodes 6 and forming the cover member 9 covering the side surface of the terminal 15. Accordingly, the SAW device 1 restrained from pullout of the terminal 15 is formed.

The step of forming the cover member 9 has a step (FIG. 2C and FIG. 3B) of forming the cover member-forming layer (wall section-forming layer 31 and lid-forming layer 43) which becomes the cover member 9. Further, the step of forming the cover member 9 has a step (FIG. 2D and FIG. 3A and FIG. 3C and FIG. 3D) of forming the combined hole 53 in the cover member-forming layer. In the combined hole 53, in at least a portion of the vertical direction of the terminal 15, the first surface 3a side has a diameter larger than that of the side opposite to the first surface 3a. Then, in the step (FIG. 4B) of forming the terminal 15, a conductive material (metal) is filled in the combined hole 53 to form the terminal 15.

Accordingly, in at least a portion of the vertical direction, the terminal 15 where the first surface 3a side has a diameter larger than that of the side opposite to the first surface 3a is easily formed. In addition, in comparison with the method of formation of the later explained fourth modification (see FIG. 6A to FIG. 6D), it is not necessary to provide a resist layer, which is removed later, for only forming the columnar sections of the terminal 15, so the manufacturing method is simplified.

In the step of forming the combined hole 53, the combined hole 53 is formed by removal of a portion of the cover member-forming layer (wall section-forming layer 31 and lid-forming layer 43) by negative photolithography. Accordingly, by positively utilizing a phenomenon which is originally undesirable such as diffusion of light for exposure, it is possible to form a combined hole 53 having a larger diameter on the first surface 3a side than that of the side opposite to the first surface 3a in at least a portion of the vertical direction of the terminal 15. As a result, it is not necessary to add a special step for making the diameter of a portion of the combined hole 53 larger, so the manufacturing method is simplified.

The step of forming the cover member-forming layer has a step (FIG. 2C) of forming the wall section-forming layer 31 which forms the wall section 19 of the vibration space 17 and a step (FIG. 3B) of forming the lid-forming layer 43 which forms the lid 21 of the vibration space 17 on the wall section-forming layer 31. The step of forming the combined hole 53 has, before the step of forming the lid-forming layer 43, a step (FIG. 2D and FIG. 3A) of removing a portion of the wall section-forming layer 31 by negative photolithography to form the opening 39 which becomes the vibration space 17 and the first hole portion 41. The first hole portion 41 is the hole which becomes the surface side portion in the combined hole 53 and has a larger diameter on the first surface 3a side than that of the side opposite to the first surface 3a. Further, the step of forming the combined hole 53 has, after the step of forming the lid-forming layer 43, a step (FIG. 3C and FIG. 3D) of removing a portion of the lid-forming layer 43 by negative photolithography to form the second hole portion 51. The second hole portion 51 is the hole which becomes the portion on the side opposite to the first surface 3a in the combined hole 53, has a diameter on the first surface 3a side enlarged from that of the side opposite to the first surface 3a, and has a diameter on the first surface 3a side larger than the diameter of the first hole portion 41 on the side opposite to the first surface 3a.

Accordingly, as explained above, the combined hole 53 capable of forming two tapered portions (first columnar section 23 and second columnar section 25) of the terminal 15 having a diameter reduced in a portion in the opening direction is realized by the formation of the first hole portion 41 and second hole portion 51 having simple shapes.

Note that, in the above embodiment, the SAW device 1 is an example of the acoustic wave device of the present invention, the piezoelectric substrate 3 is an example of the substrate of the present invention, and the first surface 3a is an example of the surface of the substrate of the present invention. Further, the comb-shaped electrode 6 is an example of the excitation electrode of the present invention, the first columnar section 23 is an example of the first tapered portion of the present invention, and the second columnar section 25 is an example of the second tapered portion of the present invention.

The present invention is not limited to the above embodiment, but may be worked in a variety of ways.

The acoustic wave device is not limited to a SAW device. For example, the acoustic wave device may be a film bulk acoustic resonator. In the acoustic wave device, the protective layer (7) and connection strengthening layer (13) may be omitted. Conversely, another suitable layer may be formed. For example, in the embodiment, a metal layer (flat sheet) which is stacked on the wall section 19 or lid 21 and is supported by the terminal 15 connected to the reference potential may be provided. In this case, the strength against bending of the lid 21 can be reinforced by the metal layer.

The terminal is not limited to tapered one. A terminal in which the surface side has a diameter larger than that of the side opposite to the surface in at least a portion of the vertical direction may be realized by a suitable shape.

Figure 5A:
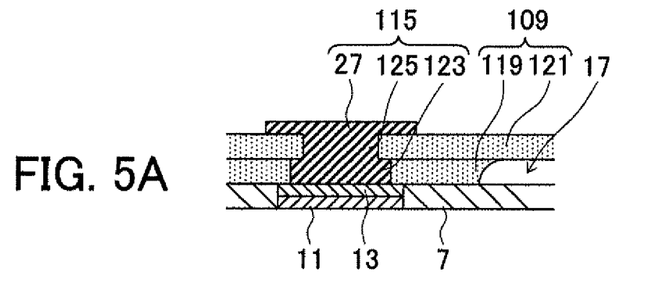

FIG. 5A is a schematic cross-sectional view showing a terminal 115 of the first modification. The terminal 115 has a first columnar section 123 vertically provided on the connection strengthening layer 13, a second columnar section 125 vertically provided on the first columnar section 123, and a land 27 provided on the second columnar section 125. The first columnar section 123 and the second columnar section 125 are formed in columnar shapes. Further, the diameter of the first columnar section 123 is larger than the diameter of the second columnar section 125.

According to the first modification, in the same way as the embodiment, the terminal 115 engages with a cover member 109 whereby pullout is suppressed. Further, in the wall section 119 and lid 121 of the cover member 109, a hole having a uniform diameter in the opening direction may be formed, therefore the degree of freedom of selection of a method of forming a hole increases.

Further, when the terminal has a tapered portion, the number of tapered portions is not limited to two. The number of tapered portions may be one or three or more as well.

Figure 5B:
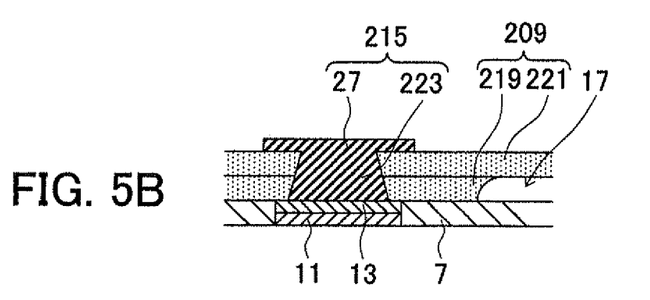

FIG. 5B is a schematic cross-sectional view showing a terminal 215 of the second modification. The terminal 215 has a columnar section 223 vertically provided on the connection strengthening layer 13 and a land 27 provided on the columnar section 223. The columnar section 223 is the entire portion of the terminal 15 which has a side surface covered by the cover member 9. It is formed in a single taper. Note that, in order to form such a columnar section 223, for example, negative photolithography may be carried out to make the diameter of the hole formed in the lid 221 smaller than the diameter of the hole formed in the wall section 219.

According to the second modification, in the same way as the above embodiment, the terminal 215 engages with the cover member 209, whereby pullout is suppressed. Further, in the terminal 215 and at the portion of the cover member 209 covering the terminal 215, formation of angle portions is suppressed, so occurrence of stress concentration is suppressed and the durability is improved.

Further, in the terminal, in the entire portion where the side surface is covered by the cover member, formation of a taper is not necessary.

Figure 5C:
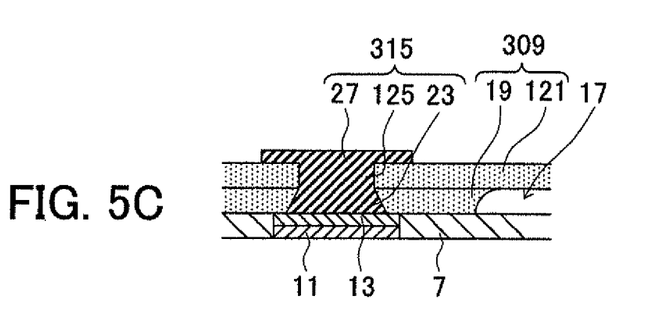

FIG. 5C is a schematic cross-sectional view showing a terminal 315 of the third modification. The terminal 315 has a first columnar section 23 vertically provided on the connection strengthening layer 13, a second columnar section 125 vertically provided on the first columnar section 23, and a land 27 provided on the second columnar section 125. The first columnar section 23 is formed in a taper in the same way as the embodiment, while the second columnar section 125 is formed in a columnar shape in the same way as the first modification.

According to the third modification, in the same way as the above embodiment, the terminal 315 engages with a cover member 309 whereby pullout is suppressed. Further, in the lid 121, it is not necessary to form a tapered hole, so the degree of freedom of selection of the method of forming the hole is high. As a result, it becomes easy to make the material forming the wall section 19 and the material forming the lid 121 different and so on. Note that, opposite to the third modification, the first columnar section may be formed in a columnar state, while the second columnar section may be formed in a taper.

The position of the step (29) formed by the first tapered portion (23) and the second tapered portion (125) from the surface (3a) does not have to coincide with the position of the ceiling (21a) of the vibration space (17) from the surface (3a). Further, the manufacturing method for making the position of the step and the position of the ceiling not coincident can be suitably selected as well. For example, in the above embodiment, the cover member was formed by two photoresist layer (31, 43), but the cover member may be configured by a plurality of photoresist layers of a number larger than the former to form a step of a taper at a suitable position as well.

In the above embodiment, the step of forming the terminal was carried out after the step of forming the cover member, but the cover member may be formed after the step of forming the terminal as well.

FIG. 6A to FIG. 6D are schematic cross-sectional views for explaining a method for manufacturing a SAW device 401 of a fourth modification. In the fourth modification, after the terminal 415 is formed, a cover member 409 (FIG. 6D) is formed. Specifically, this is as follows.

Figure 6A:
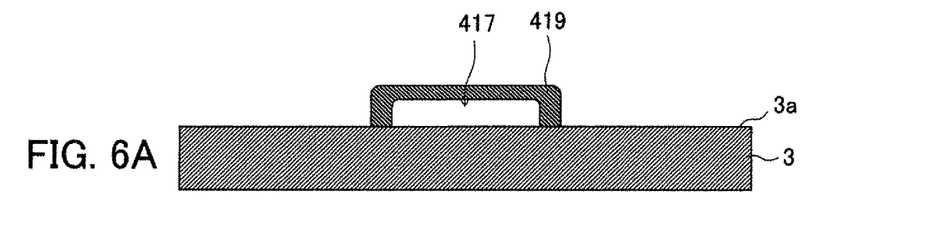

First, as shown in FIG. 6A, on the first surface 3a of the piezoelectric substrate 3, an inner-shell section 419 forming a vibration space 417 is formed above the SAW element (not shown). The inner-shell section 419 forms the inner side portion of the cover member 409. The inner-shell section 419 is formed by for example a photosensitive resin.

Figure 6B:
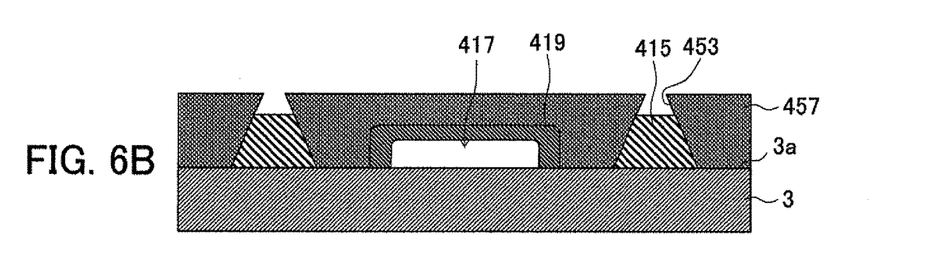

Next, as shown in FIG. 6B, a terminal-use resist layer 457 having a hole 453 formed in it is formed. A terminal 415 is formed by filling a conductive material in the hole 453. The hole 453 and terminal 415 are for example formed in a taper as a whole in the same way as the second modification.

Figure 6C:
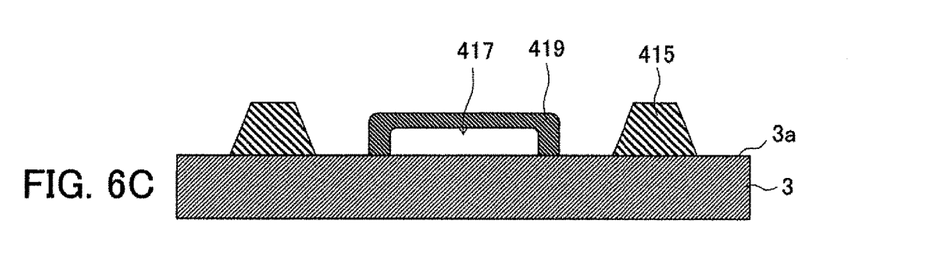

After that, as shown in FIG. 6C, the terminal-use resist layer 457 is removed. Accordingly, the side surface of the terminal 415 is exposed.

Figure 6D:
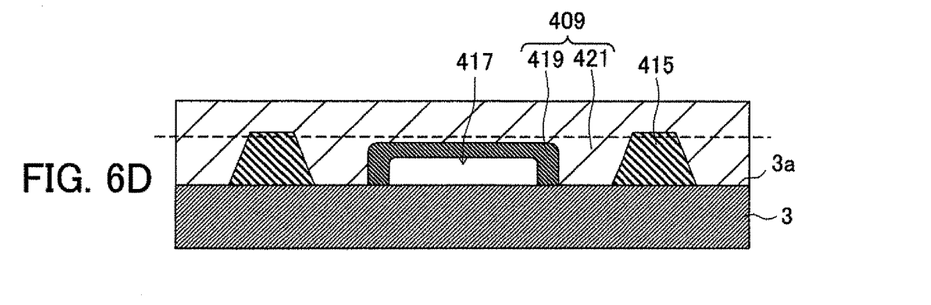

Then, as shown in FIG. 6D, the inner-shell section 419 and the terminal 415 are sealed by a resin. The top surface side portion of the sealing resin is ground until the terminal 415 is exposed (up to the position indicated by a dotted line). By the ground sealing resin, an outer-shell section 421 forming the outer side portion of the cover member 409 is formed.

Note that when the terminal is formed earlier than the cover member, the method of forming the terminal is not limited to the method of filling a conductive material in a hole formed in the resist layer. For example, by performing vapor deposition of the metal through masks several times by using a plurality of masks having transmission holes with diameters different from each other, a terminal having a diameter enlarged at suitable positions may be formed.

When forming a hole in the cover member etc. and filling a conductive material in the hole to form a terminal, the formation of the hole is not limited to formation using photolithography. For example, the hole may be formed by ablation by a laser beam. Note that, in this case, the tapered surface can be formed by for example making the irradiation angle of the laser beam incline relative to the surface of the substrate.

Further, when the hole in which a conductive material is to be filled to form the terminal is formed by photolithography, the formation of the tapered surface is not limited to one utilizing diffusion of light in negative photolithography. For example, in positive or negative photolithography, it is possible to form the tapered surface by irradiating the light at an angle relative to the surface of the substrate. Further, in negative photolithography, it is possible to form a tapered hole in which the diameter of the surface side is enlarged by irradiating the light at the resist while reducing the diameter of the light by the reduced projection system.

In the above embodiment, in the tapered portion of the terminal, the surface side was enlarged in diameter compared with that of the side opposite to the surface. However, the tapered portion of the terminal may be formed so that the side opposite to the surface is enlarged in diameter compared with that of the surface side as well.

Figure 7:
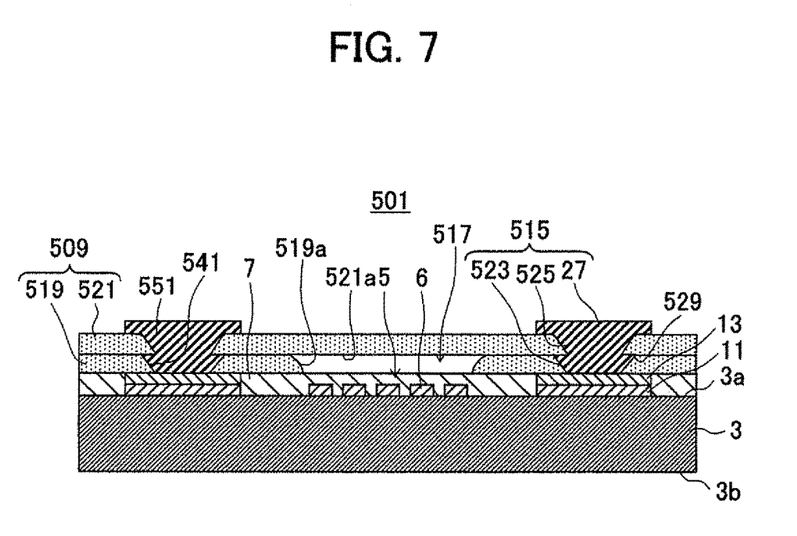
FIG. 7 A schematic cross-sectional view showing a SAW device according to a fifth modification of the present invention.

FIG. 7 is a schematic cross-sectional view showing a SAW device 501 according to a fifth modification.

Each of the first columnar section 523 and the second columnar section 525 of a terminal 515 is formed in a taper where the diameter of the side opposite to the first surface 3a is enlarged from that of the first surface 3a side. The end face of the first columnar section 523 on the second columnar section 525 side is larger in diameter than the end face of the second columnar section 525 on the first columnar section 523 side. At the boundary between the first columnar section 523 and the second columnar section 525, a step 529 at which the first surface 3a side has a diameter enlarged more than the side opposite to the first surface 3a is formed. In other words, the terminal 515 has a third tapered portion (first columnar section 523) in which the cross-sectional area of the side opposite to the first surface 3a is larger than the cross-sectional area of the first surface 3a side and has a fourth tapered portion (second columnar section 525) which continues from the third tapered portion and has a cross-sectional area on the side opposite to the first surface 3a larger than the cross-sectional area of the first surface 3a side. Further, when comparing the cross-sectional area of the third tapered portion on the fourth tapered portion side with the cross-sectional area of the fourth tapered portion on the third tapered portion side, the cross-sectional area of the third tapered portion on the fourth tapered portion side is made larger. Note that, the first columnar section 523 and the second columnar section 525 may have the same size and shape as each other or have sizes and shapes different from each other.

According to such a configuration, by engagement of the step 529 with the cover member 509 from the side by the first surface 3a, pullout of the terminal 515 is suppressed.

The method for manufacturing the SAW device 501 is substantially the same as the method for manufacturing the SAW device 1 of the above embodiment. Note, in the method for manufacturing the SAW device 501, a wall section 519 and frame section 521 are formed by positive photolithography in place of negative photolithography.

When a first hole portion 541 and a second hole portion 551 to be filled with metal to form a terminal 515 are formed by positive photolithography, in the same way as the above embodiment, a first columnar section 541 and second columnar section 551 form tapered shapes due to diffusion of light. However, the irradiated region and the not irradiated region of the light are reverse to those of the type, therefore the first hole portion 541 and second hole portion 551 are enlarged in their diameters in a direction reverse to that for the first hole portion 41 and second hole portion 51 in the above embodiment.

Further, due to the formation of a vibration space 517 by positive photolithography, an inner wall 519a and a ceiling 521a have shapes inverse to those of the inner wall 19a and ceiling 21a in the first embodiment, that is, shapes where the diameter becomes larger toward the side opposite to the first surface 3a.

Note that, as explained above, a tapered hole can be formed by obliquely irradiating light and so on. Therefore, it is also possible to form the first hole portion 541 and second hole portion 551 by negative photolithography.

The vibration space is not limited to one formed by closing an opening of a wall section of a cover member by a lid formed separately from the wall section. For example, a vibration space may be formed by forming a resist having the same shape as that of the vibration space on the substrate, forming a cover member-forming layer which becomes the cover member on that, then removing the resist through a through hole provided in the cover member-forming layer.

The vibration space does not have to be formed in an arch shape. Further, when forming the vibration space in an arch shape, the arch is not limited to one formed by chamfering the portion of the inner wall on the ceiling side to a curved surface. For example, the arch may be formed by configuration of the entire inner wall by a planar tapered surface. Further, the position of the boundary between the first tapered portion and the second portion from the first surface 3a does not always have to coincide with the position of the ceiling of the vibration space 17 from the first surface 3a. The positions of the two may be offset as well.

Further, the inclination angles (angles formed by the tapered portions together with the first surface 3a of the piezoelectric substrate) of the first tapered portion and second tapered portion may be made different from each other as well. For example, the first columnar section 23 and second columnar section 25 may be formed so that the inclination angle of the first tapered portion becomes larger than the inclination angle of the second tapered portion. By making the inclination angle of the first tapered portion and the inclination angle of the second tapered portion different in this way, when force is applied in a direction pushing against the terminal 15, the force transmitted to the wall section 19 can be dispersed in a broader range.

REFERENCE SIGNS LIST

1 . . . SAW device (acoustic wave device), 3 . . . piezoelectric substrate (substrate), 3a . . . first surface (surface), 6 . . . comb-shaped electrode (excitation electrode), 9 . . . cover member, and 15 . . . terminal.

The invention claimed is:

1. An acoustic wave device, comprising:
a substrate on which an excitation electrode is provided; and
a cover member which is arranged so that at least a portion covers the excitation electrode and which has a hole portion comprising a terminal thereinside, the terminal being electrically connected to the excitation electrode,
wherein, in a cross-sectional view, the terminal of the hole portion has widths at a first position and a second position, which have distances up to a surface of the substrate different from each other, are broader than a width at a third position which is positioned between the first position and the second position.

2. The acoustic wave device according to claim 1, wherein the cover comprises;
a projection which projects toward the terminal, on an inner wall of the hole portion.

3. The acoustic wave device according to claim 2, wherein the projection is provided in a height region corresponding to the third position.

4. The acoustic wave device according to claim 1, wherein an inner wall of the hole portion has sections inclined in the same direction in both of a region which is positioned above the third position and a region which is positioned below the third position.

5. The acoustic wave device according to claim 4, wherein the inner wall of the hole portion is inclined outwardly in both of the region which is positioned above the third position and the region which is positioned below the third position.

6. The acoustic wave device according to claim 4, wherein the hole portion is formed by laser machining.

7. The acoustic wave device according to claim 1, wherein the cover member comprises;
- a lid section which is arranged with a space from the substrate; and
- a wall section which is provided between the lid section and the substrate, and
- the width of the wall section increases on the substrate side.

8. The acoustic wave device according to claim 1, wherein the cover member comprises;
- a lid section which is arranged with a space from the substrate,
- a wall section which is provided between the lid section and the substrate, and
- a corner section provided between the inner surface of the wall section and the inner surface of the lid section is rounded.

9. A circuit board, comprising:
- an acoustic wave device according to claim 1 and
- a second substrate on which the acoustic wave device is mounted by said terminal and solder.

10. An acoustic wave device, comprising:
- a substrate on which an excitation electrode is provided; and
- a cover member which is arranged so that at least a portion covers the excitation electrode and which has a hole portion comprising a terminal thereinside, the terminal being electrically connected to the excitation electrode,
- wherein, in a cross-sectional view, the cover comprises; a projection which projects toward the terminal on an inner wall of the hole portion which is separated from both the upper and lower ends of the hole portion.

11. The acoustic wave device according to claim 10, wherein the inner wall of the hole portion has sections which are inclined in the same direction in both of a region which is positioned above the projection and a region which is positioned below the projection.

12. The acoustic wave device according to claim 11, wherein the inner wall of the hole portion is inclined outwardly in both of the region which is positioned above the projection and the region which is positioned below the projection.

13. The acoustic wave device according to claim 11, wherein the hole portion is formed by laser machining.

14. The acoustic wave device according to claim 10, wherein the cover member comprises;
- a lid section which is arranged with a space from the substrate; and
- a wall section which is provided between the lid section and the substrate; and
- the width of the wall section increases on the substrate side.

15. The acoustic wave device according to claim 10, wherein the cover member comprises;
- a lid section which is arranged with a space from the substrate; and
- a wall section which is provided between the lid section and the substrate; and
- a corner section provided between the inner surface of the wall section and the inner surface of the lid section is rounded.

16. An acoustic wave device, comprising:
- a substrate on which an excitation electrode is provided and
- a cover member which is arranged so that at least a portion covers the excitation electrode and which has a hole portion comprising a terminal thereinside, the terminal being electrically connected to the excitation electrode,
- wherein, in a cross-sectional view, the terminal of the hole portion has widths at a first position and a second position, which have distances up to a surface of the substrate different from each other, are broader than a width at a fourth position which is positioned between the first position and the second position.

17. The acoustic wave device according to claim 16, wherein, on a side surface of the terminal, a projection which projects toward an inner wall of the hole portion is provided.

18. The acoustic wave device according to claim 17, wherein the projection is provided in a height region which corresponds to the fourth position.

19. The acoustic wave device according to claim 16, wherein an inner wall of the hole portion comprises sections which are inclined in the same direction in both of a region which is positioned above the fourth position and a region which is positioned below the fourth position.

20. The acoustic wave device according to claim 19, wherein the inner wall of the hole portion is inclined outwardly in both of the region which is positioned above the fourth position and the region which is positioned below the fourth position.

21. The acoustic wave device according to claim 19, wherein the hole portion is formed by laser machining.

22. The acoustic wave device according to claim 16, wherein the cover member comprises;
- a lid section which is arranged with a space from the substrate, and
- a wall section which is provided between the lid section and the substrate, and
- the width of the wall section increases on the substrate side.

23. The acoustic wave device according to claim 16, wherein the cover member comprises
- a lid section which is arranged with a space from the substrate, and
- a wall section which is provided between the lid section and the substrate, and
- a corner section provided between the inner surface of the wall section and the inner surface of the lid section is rounded.

24. A circuit board comprising
- an acoustic wave device according to claim 16 and
- a second substrate on which the acoustic wave device is mounted by the terminal and solder.

25. The acoustic wave device comprising:
- a substrate on which an excitation electrode is provided and
- a cover member which is arranged so that at least a portion covers the excitation electrode and which has a hole portion comprising a terminal thereinside, the terminal being electrically connected to the excitation electrode,
- wherein, in a cross-sectional view, the terminal comprises a projection which projects toward an inner wall of the hole portion is provided separated from both of the upper and lower ends of the hole portion.

26. The acoustic wave device according to claim 25, wherein the inner wall of the hole portion comprises sections which are inclined in the same direction in both of a region which is positioned above the projection and a region which is positioned below the projection.

27. The acoustic wave device according to claim 26, wherein the inner wall of the hole portion is inclined outwardly in both of the region which is positioned above the projection and the region which is positioned below the projection.

28. The acoustic wave device according to claim 26, wherein the hole portion is formed by laser machining.

29. The acoustic wave device according to claim 25, wherein the cover member comprises;
   a lid section which is arranged with a space from the substrate, and
   a wall section which is provided between the lid section and the substrate, and
   the width of the wall section increases on the substrate side.

30. The acoustic wave device according to claim 25, wherein the cover member comprises;
   a lid section which is arranged with a space from the substrate, and
   a wall section which is provided between the lid section and the substrate, and
   a corner section provided between the inner surface of the wall section and the inner surface of the lid section is rounded.

* * * * *